United States Patent
An (10) Patent No.: US 7,263,008 B2
(45) Date of Patent: Aug. 28, 2007

(54) SEMICONDUCTOR MEMORY DEVICE FOR SECURING A STABLE OPERATION AT A HIGH SPEED OPERATION

(75) Inventor: Yong-Bok An, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/313,961

(22) Filed: Dec. 22, 2005

(65) Prior Publication Data

US 2007/0002643 A1    Jan. 4, 2007

(30) Foreign Application Priority Data

Jun. 30, 2005   (KR) ...................... 10-2005-0058892

(51) Int. Cl.
*G11C 7/00*  (2006.01)
(52) U.S. Cl. ...................... 365/193; 365/194; 365/198
(58) Field of Classification Search ................ 365/193, 365/194, 198, 189.05
See application file for complete search history.

(56) References Cited

U.S. PATENT DOCUMENTS

| 6,262,938 | B1 | 7/2001 | Lee et al. |
| 6,542,416 | B1 | 4/2003 | Hampel et al. |
| 6,564,287 | B1 | 5/2003 | Lee |
| 6,618,319 | B2 * | 9/2003 | Ooishi et al. ............... 365/233 |
| 6,636,446 | B2 | 10/2003 | Lee et al. |
| 6,809,971 | B2 * | 10/2004 | Terzioglu et al. ........... 365/194 |
| 6,888,776 | B2 * | 5/2005 | Watanabe et al. ...... 365/230.06 |
| 2005/0088906 | A1 | 4/2005 | Kim |
| 2005/0128825 | A1 | 6/2005 | Cho |

FOREIGN PATENT DOCUMENTS

| JP | 2000-231788 | 8/2000 |
| JP | 2004-192791 | 7/2004 |
| JP | 2004-327008 | 11/2004 |
| KR | 10-2005-0011954 | 1/2005 |
| KR | 10-2005-0059921 | 6/2005 |

* cited by examiner

*Primary Examiner*—Tuan T. Nguyen
(74) *Attorney, Agent, or Firm*—McDermott Will & Emery LLP (57) ABSTRACT

A semiconductor memory device for broadening a data I/O window includes: a buffer driving block for generating a buffer driving signal in response to an additive delay signal and a CAS delay signal, wherein an activation period of the buffer driving signal is determined based on the additive delay signal and a combination of delayed additive delay signals; and a data buffer for receiving an external data at an activation of the buffer driving signal.

12 Claims, 10 Drawing Sheets

SEMICONDUCTOR MEMORY DEVICE FOR SECURING A STABLE OPERATION AT A HIGH SPEED OPERATION

FIELD OF INVENTION

The present invention relates to a semiconductor memory device; and, more particularly, to a semiconductor memory device for securing a stable operation at a high-speed operation.

DESCRIPTION OF PRIOR ART

Generally, a signal transmission in a semiconductor memory device is delayed by a time constant according to a capacitance and a resistance of a transmission line through which a signal is passed. Such a transmission delay is determined by a gate capacitance of a complementary metal-oxide semiconductor (CMOS) transistor included in the semiconductor memory device and the time constant due to the resistance and a parasitic capacitance of the transmission line. Also, due to variations of process, voltage and temperature (PVT), a signal transmission speed can be changed.

Meanwhile, when the semiconductor memory device is operated in synchronization with a clock, a setup/hold time should be satisfied on the basis of an edge of the clock in order to detect externally inputted commands and data. However, due to the PVT variation, the transmission delay is changed and, thus, a command and a data may not be detected in synchronization with the clock. This problem can be generated under a fast condition, a typical condition and a slow condition. Particularly, the detection failure is more notable under the slow condition.

Therefore, it is important to secure a margin for stably detecting the command and the data in spite of the PVT variation. For instance, in a specification of a double data rate (DDR) synchronous dynamic random access memory (SDRAM) and a DDR2 SDRAM, a margin tDQSS is defined as WL (write latency)±0.25×tCK, wherein the margin tDQSS is a required time margin for the data to be synchronized with the clock so that the data can be validly detected.

Herein, the WL is defined as 1×tCK regardless of a CL (CAS latency) for the DDR SDRAM. For the DDR2 SDRAM, the WL is defined as (AL+CL−1)×tCK, where the AL is an additive latency. Accordingly, in case of the DDR2 SDRAM, the WL can be changed when the AL or the CL is changed.

Meanwhile, in case of the DDR2 SDRAM, a process for detecting an external data is described below.

Figure 1:
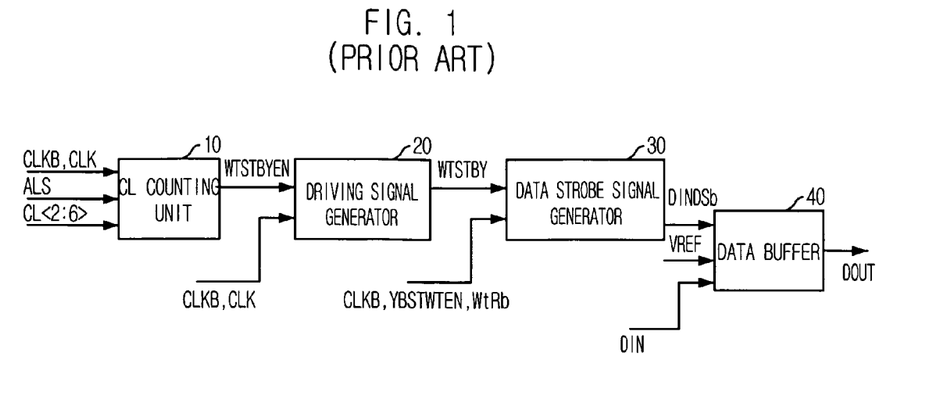
FIG. 1 is a block diagram showing a conventional semiconductor memory device.

FIG. 1 is a block diagram showing a conventional semiconductor memory device.

As shown, the conventional semiconductor memory device includes a CL counting unit 10, a driving signal generator 20, data strobe signal generator 30 and a data buffer 40.

The CL counting unit 10 delays an additive delay signal ALS for a corresponding time of the CL. The driving signal generator 20 generates a driving signal WTSTBY in response to a write delay time WTSTBYEN generated by the CL counting unit 10.

The data strobe signal generator 30 generates a data strobe signal DINDSb in response to the driving signal WTSTBY and control signals YBSTWTEN and WtRb. The data buffer 40 for receiving an external data DIN in response to the data strobe signal DINDSb.

That is, the conventional semiconductor memory device generates the additive delay signal ALS after a lapse of a corresponding time of the AL since an input of a write command. Then, the write delay time WTSTBYEN is generated by delaying the additive delay signal ALS for the corresponding time of the CL.

Thereafter, the driving signal generator 20 generates the driving signal WTSTBY in response to the write delay time WTSTBYEN, and the data strobe signal generator 30 activates the data strobe signal DINDSb in response to the driving signal WTSTBY and the control signals YBSTWTEN and WtRb. That is, the data strobe signal DINDSb is activated after a corresponding time of AL+CL is lapsed since the input of the write command.

Thereafter, the data buffer 40 receives the external data DIN in response to an activation of the data strobe signal DINDSb.

Figure 2:
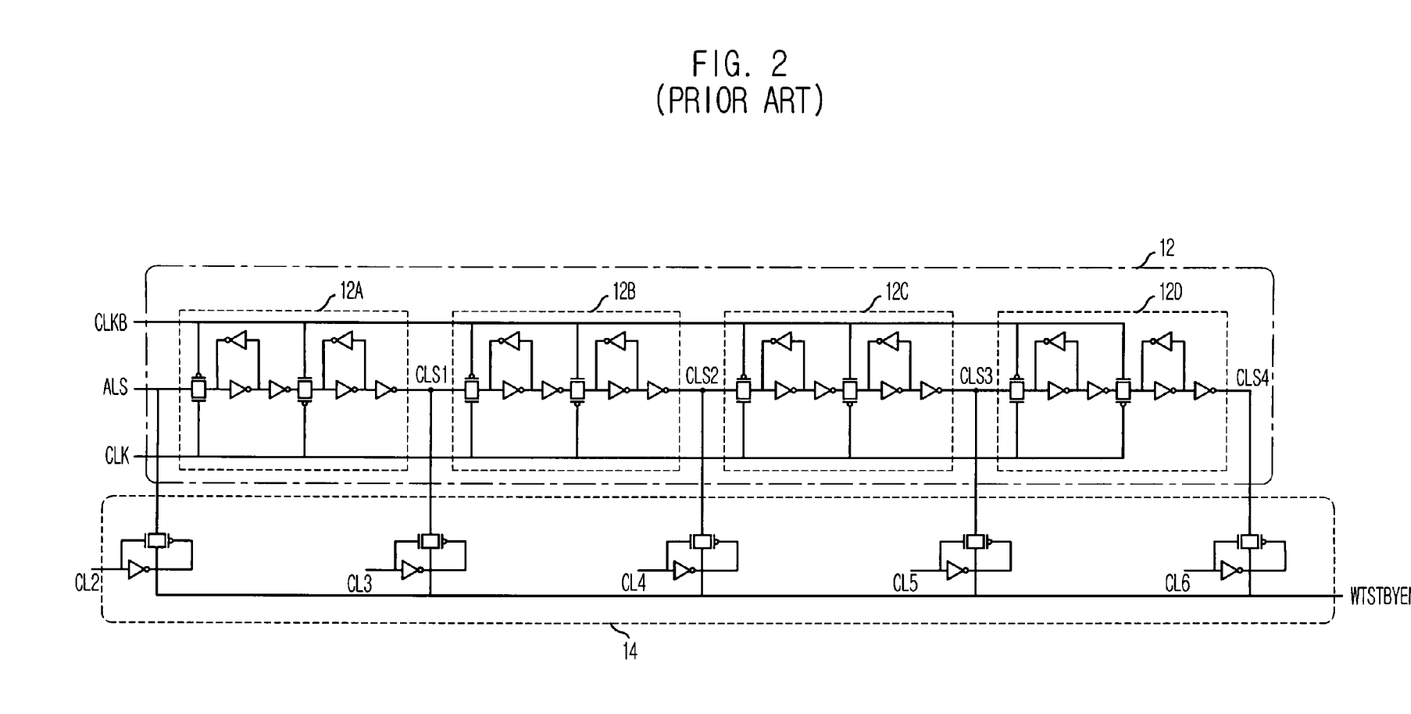
FIG. 2 is a schematic circuit diagram showing the CL counting unit shown in FIG. 1.

FIG. 2 is a schematic circuit diagram showing the CL counting unit 10 shown in FIG. 1.

As shown, the CL counting unit 10 includes a first delay unit 12 for generating a first to a fourth CAS delay signals CLS1 to CLS4 by delaying the additive delay signal ALS for the corresponding time of the CL; and a selection unit 14 for selecting one of the first to the fourth CAS delay signals CLS1 to CLS4 to thereby output the selected signal as the write delay signal WTSTBYEN.

Herein, the first delay unit 12 includes a first to a fourth latches 12a to 12d connected in series for storing an input signal in response to a clock signal CLK and a clock bar signal CLKB. That is, each latch receives an output of a preceding latch in synchronization with the clock signal CLK and the clock bar signal CLKB to thereby generate a CAS delay signal.

Meanwhile, the selection unit 14 includes a plurality of transfer gates each of which receives one of a first to a fifth CL indication signals CL2 to CL6. In response to the first to the fifth CL indication signals CL2 to CL6, a corresponding CAS delay signal is outputted as the write delay signal WTSTBYEN.

Accordingly, the CL counting unit 10 activates the write delay signal WTSTBYEN by delaying the additive delay signal ALS for the corresponding time of the CL. That is, since the additive delay signal ALS has a delay amount of the corresponding of the AL, the write delay signal WTSTBYEN is activated after the corresponding time of AL+CL is passed since the input of the write command.

Figure 3:
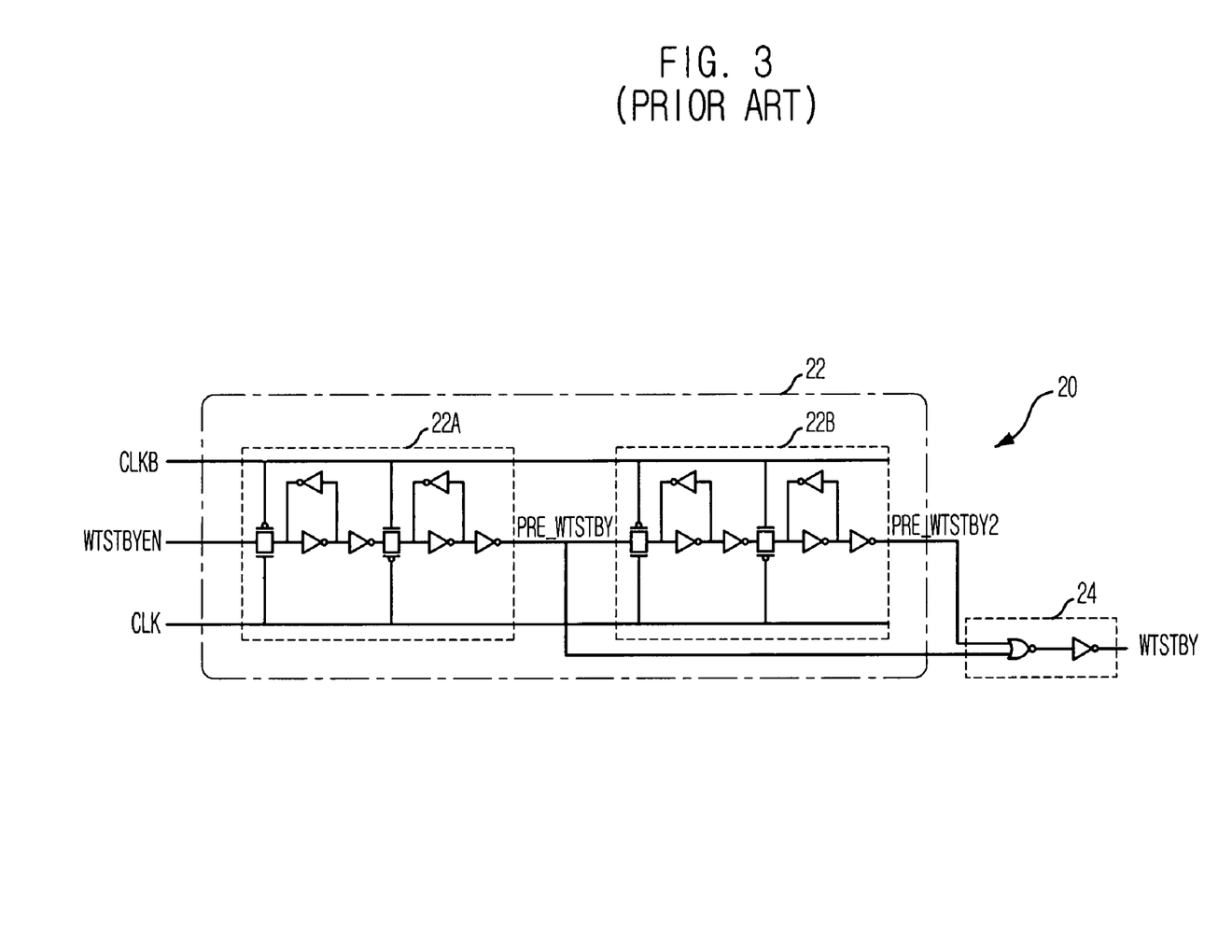
FIG. 3 is a driving signal generator shown in FIG. 1.

FIG. 3 is a driving signal generator 20 shown in FIG. 1.

As shown, the driving signal generator 20 includes a second delay unit 22 for delaying the write delay signal WTSTBYEN; and an output unit 24 for outputting a first output and a second output of the second delay unit 22 as the driving signal WTSTBY.

The second delay unit 22 includes a fifth and a sixth latches 22a and 22b connected in series each for storing an input signal in response to the clock signal CLK and the clock bar signal CLKB. The output unit 24 performs a logic operation to the first output generated by the fifth latch 22a and the second output generated by the sixth latch 22b.

Herein, the driving signal generator 20 serves to adjust an activation period width of the driving signal WTSTBY according to a burst length. The burst length of the DDR2 SDRAM is 4×(2×tCK) or 8×(4×tCK). Accordingly, since a minimum of the burst length is 4, the second delay unit 22 is constituted with two latches.

Therefore, second delay unit 22 generates the first output (PRE_WTSTBY1) by delaying the write delay signal WTSTBYEN for one clock and generates the second output (PRE_WTSTBY2) by delaying the write delay signal WTSTBYEN for two clocks. Then, the output unit 24 generates the driving signal WTSTBY by performing a logic operation to the first output and the second output. That is, the driving signal WTSTBY is activated in response to the write delay signal WTSTBYEN and the activation period width of the driving signal is one clock.

Figure 4:
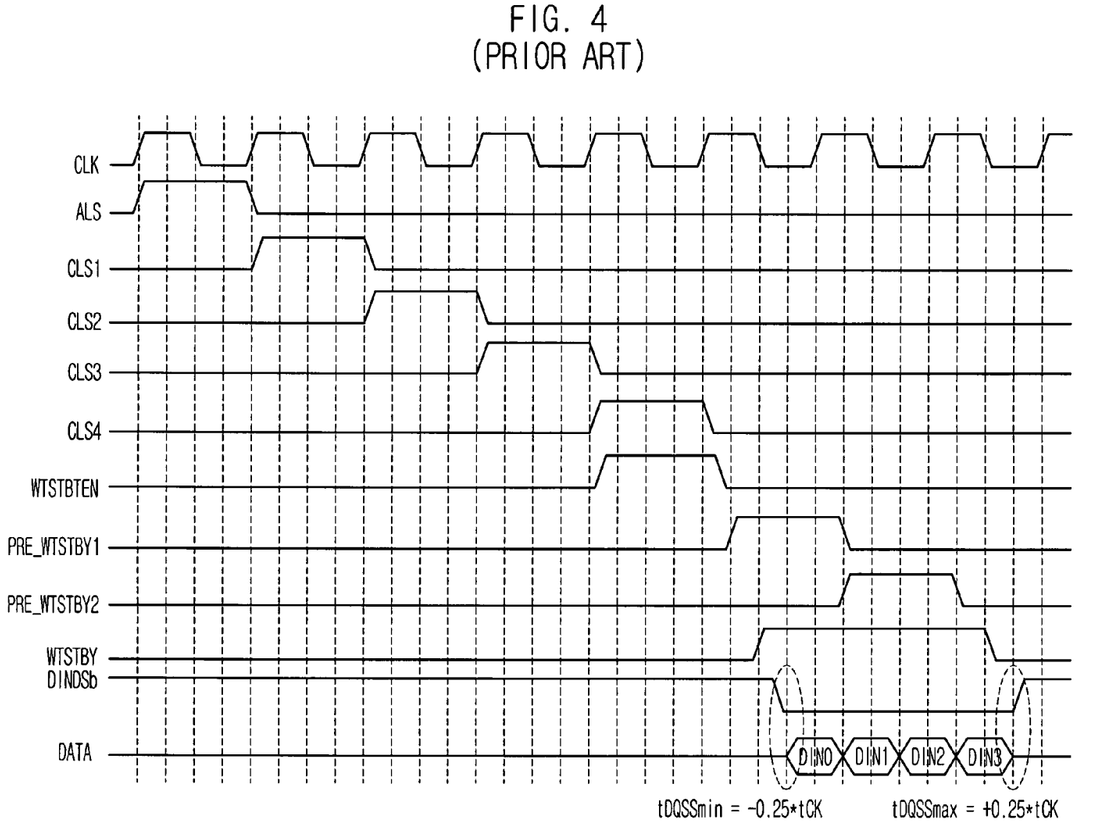
FIG. 4 is a wave diagram showing an operation of the conventional semiconductor memory device shown in FIG. 1.

FIG. 4 is a wave diagram showing an operation of the conventional semiconductor memory device shown in FIG. 1.

Referring to FIGS. 1 to 4, the operation of the semiconductor memory device is described below. Herein, it is assumed that the CL is 4.

Although not shown, the additive delay signal ALS is activated after the corresponding time of the AL is passed since the input of the write command. Thereafter, the CL counting unit 10 generates the first to the fourth CAS delay signals CLS1 to CLS4 by delaying the additive delay signal ALS for one to four clocks respectively. Then, the fourth CAS delay signal CLS4 is selected and is outputted as the write delay signal WTSTBYEN by the selection unit 14.

Thereafter, the driving signal generator 20 generates the first output PRE_WTSTBY1 and the second output PRE_WTSTBY2 by delaying the write delay signal WTSTBYEN for one clock and two clocks respectively. Then, the output unit 24 generates the driving signal WTSTBY which is activated while both the first output PRE_WTSTBY1 and the second output PRE_WTSTBY2 are activated.

Thereafter, the data strobe signal generator 30 generates a row active signal, i.e., the data strobe signal DINDSb in response to the driving signal WTSTBY.

Therefore, the external data DIN which is inputted at the activation period of the data strobe signal DINDSb is detected as an internal data through the data buffer 40.

As above-mentioned, for detecting an external data as a valid data, the data strobe signal DINDSb should satisfies the margin tDQSS, i.e., WL±0.25×tCK.

Meanwhile, the tCK, i.e., a clock cycle, can be changed according to the CL. That is, a clock cycle required for operating the conventional semiconductor memory device is determined by dividing a lapsed time from an input timing of a column command to an output/input timing of a corresponding data by the CL. Therefore, after a required time is determined, the tCK is relatively decreased if the CL has a large value. Subsequently, as the clock cycle is shortened, an activation timing of a signal required to be synchronized with a clock signal has shorter margin.

This is applied to the data strobe signal DINDSb in the same manner. That is, if the tCK is shortened, the margin tDQSS is also shortened and, also, a central axis of the margin tDQSS is moved left.

Figure 5A:
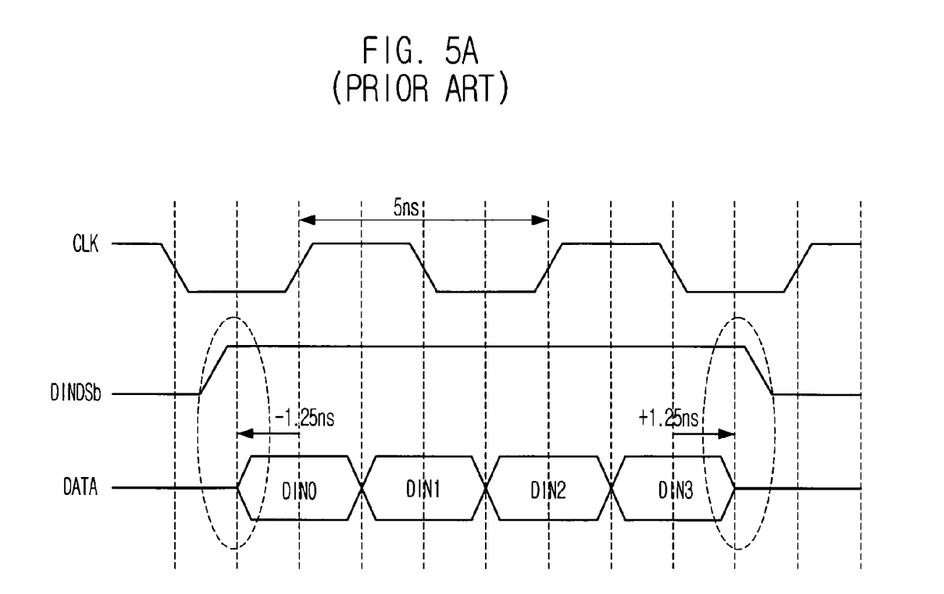
FIGS. 5A and 5B are wave diagrams showing an activation timing of a data strobe signal according to a clock cycle time.
Figure 5B:
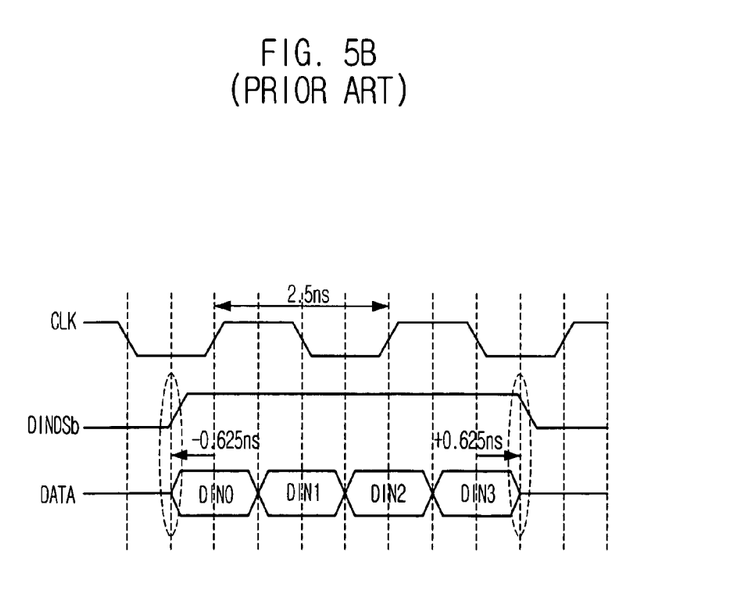

FIGS. 5A and 5B are wave diagrams showing an activation timing of the data strobe signal tDQSS according to the tCK. FIGS. 5A and 5B show the activation timing of the data strobe signal tDQSS when the tCK is 5 ns and 2.5 ns respectively.

As shown, if the tCK is decreased from 5 ns to 2.5 ns, a margin of 1.25 ns is decreased to 0.625 ns. Further, since the central axis of the margin tDQSS is moved left by 0.625 ns, a margin of 0.625 ns is lost.

However, an activation timing of a signal is not changed even though the tCK is changed since a logic circuit has a constant transmission delay when the logic circuit is operated in synchronization with a clock signal. For instance, when the transmission delay is 650 ps, a data is inputted in synchronization with a rising edge of the clock signal at 625 ps if a signal which is synchronized with the clock signal to be operated is a data transferring signal or a data latch signal. However, since an activation timing of the signal is 650 ps, a data failure occurs, i.e., the data cannot be detected.

Also, at the operation shown in FIG. 4, if the margin tDQSS is the WL, the data failure may be prevented. However, if a WL of 0.25 tCK is applied to the margin tDQSS, an error occurs between tDQSSmin and tDQSSmax. That is, as above-mentioned, a required time for activating a data buffer by generating a data strobe signal according to a driving signal is always constant. However, since the tCK and the WL are changed according to a change of the CL, the tDQSS margin is decreased and the central axis of the tDQSS is moved forward. Further, since the transmission delay is increased and a margin is more decreased at the slow condition, the data failure occurs more easily.

SUMMARY OF INVENTION

It is, therefore, an object of the present invention to provide a semiconductor memory device for securing a stable operation at a high operational speed.

In accordance with an aspect of the present invention, there is provided a semiconductor memory device for broadening a data I/O window, including a buffer driving block for generating a buffer driving signal in response to an additive delay signal and a CAS delay signal, wherein an activation period of the buffer driving signal is determined based on the additive delay signal and a combination of delayed additive delay signals; and a data buffer for receiving an external data at an activation of the buffer driving signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 6:
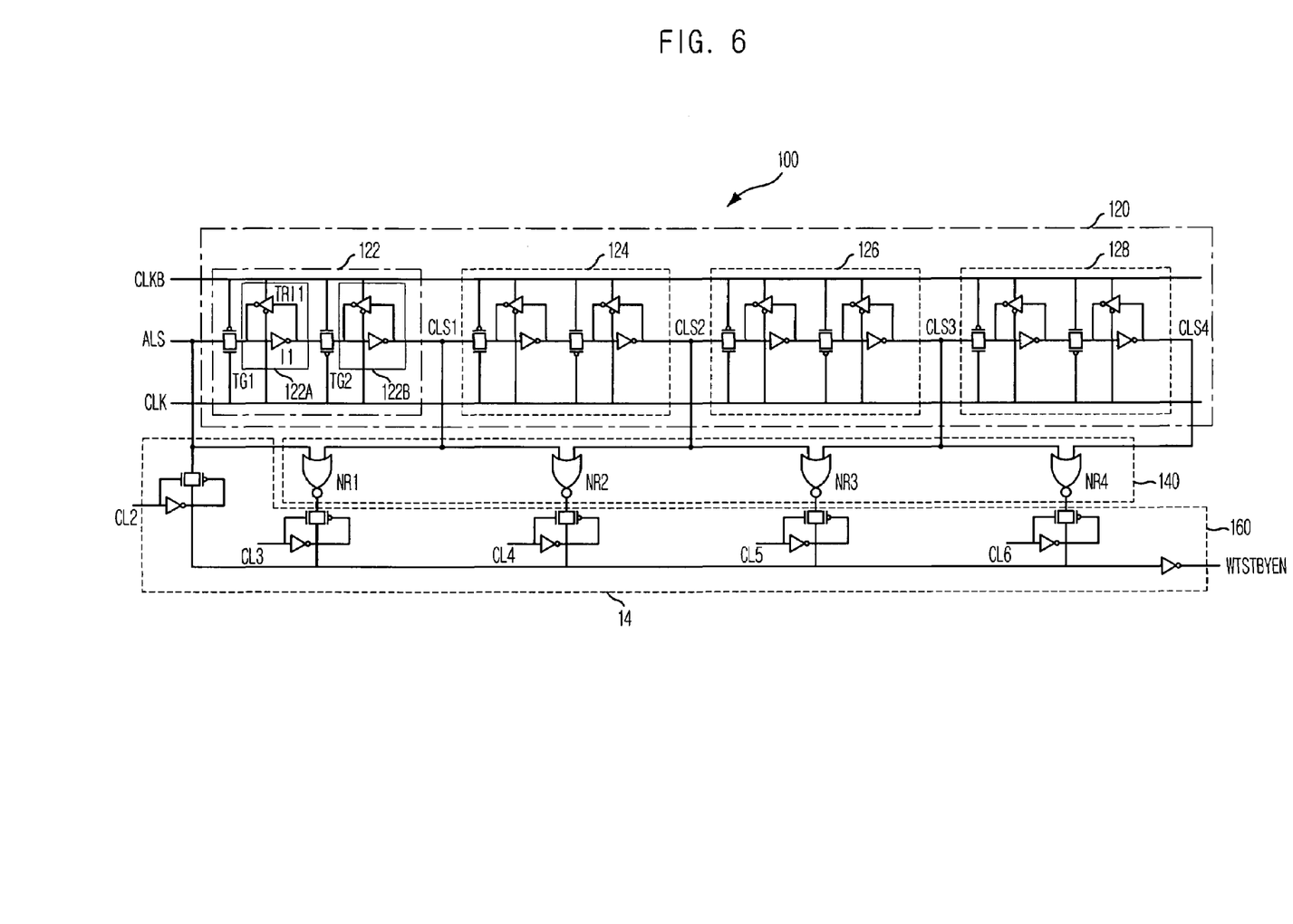
FIG. 6 is a schematic circuit diagram showing a CL (CAS latency) counting unit in accordance with the present invention.

FIG. 6 is a schematic circuit diagram showing a CL (CAS latency) counting unit 100 in accordance with the present invention.

As shown, the CL counting unit 100 includes a first delay unit 120, a pulse width extension unit 140 and a selection unit 160.

The first delay unit 120 generates a first to a fourth CAS delay signals CLS1 to CLS4 by delaying an additive delay signal ALS. The pulse width extension unit 140 extends a pulse width of the first to the fourth delay signals CLS1 to CLS4. The selection unit 160 selects one of outputs of the pulse width extension unit 140 and outputs the selected signal as a write delay signal WTSTBYEN in response to a first to a fifth CL indication signals CL2 to CL6.

The first delay unit 120 includes a first to a fourth latch units 122 to 128. Each latch unit receives an output of a preceding latch unit in synchronization with a clock signal to thereby generate a CAS delay signal.

In detail, each latch unit includes a first transfer gate TG1 for transferring the additive delay signal ALS when a clock signal CLK is in a logic high level; a first latch 122a for latching an output of the first transfer gate TG1 while the clock signal CLK is in a logic low level; a second transfer gate TG2 for transferring an output of the first latch 122a when the clock signal CLK is in a logic low level; and a second latch 122b for latching an output of the second transfer gate TG2 while the clock signal CLK is in a logic high level.

Herein, each of the first and the second latches 122a and 122b is formed by cross-coupling a tri-state inverter RTI1 and a first inverter I1. Therefore, by employing the tri-state inverter TRI1, a fighting phenomenon, which is generated at a transition of an output signal, can be prevented. Also, since the number of inverters is increased, a power consumption for a signal transmission can be reduced and the signal transmission can be performed at a higher speed. Practically, more than 70 μA of power can be reduced and the signal transmission speed can be improved more than 30 ps.

The pulse width extension unit 140 extends a pulse width of a corresponding output signal by performing a logic operation to two neighboring CAS delay signals. In detail, the pulse width extension unit 140 includes a first NOR gate NR1 for receiving the additive delay signal ALS and the first CAS delay signal CLS1; a second NOR gate NR2 for receiving the first and the second CAS delay signals CLS1 and CLS2; a third NOR gate NR3 for receiving the second and the third CAS delay signals CLS2 and CLS3; and a fourth NOR gate NR4 for receiving the third and the fourth CAS delay signals CLS3 and CLS4.

Therefore, by performing a logic NOR operation to a preceding CAS delay signal and a corresponding CAS delay signal, an activation period width of a corresponding output signal which is an active row signal is maintained while the preceding CAS delay signal and the corresponding CAS delay signal are activated. That is, since each of the preceding CAS delay signal and the corresponding CAS latency signal has one clock difference, an output of the pulse width extension unit 140 is activated one clock earlier than that of the prior art, and the activated stated is maintained for two clocks. Accordingly, a data strobe margin tDQSSmin can be sufficiently secured.

Meanwhile, the selection unit includes a plurality of transfer gates for outputting one of the additive delay signal ALS and the first to the fourth CAS delay signals CLS1 to CLS4 as the write delay signal WTSTBYEN in response to the first to the fifth CL indication signals CL2 to CL6.

Figure 7:
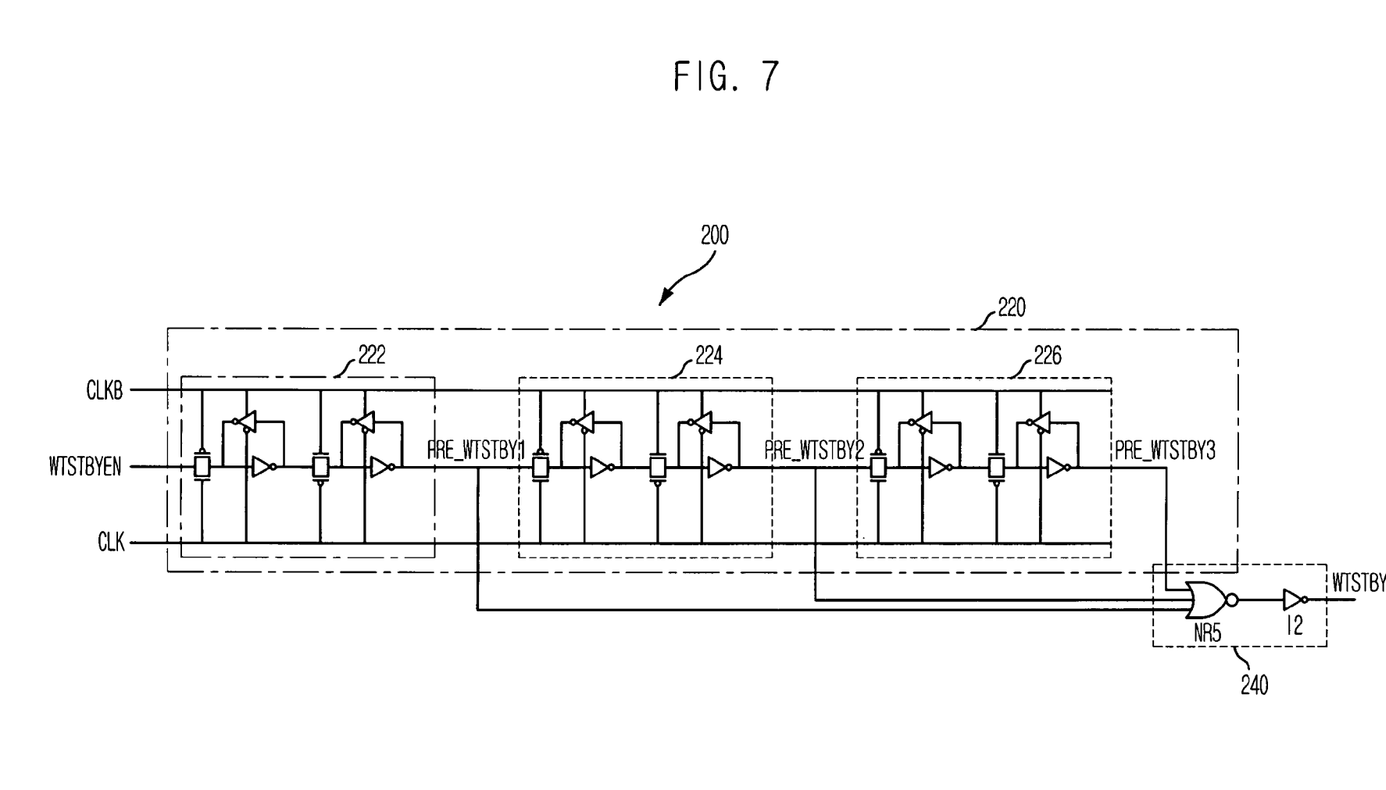
FIG. 7 is a schematic circuit diagram showing a driving signal generator in accordance with the present invention.

FIG. 7 is a schematic circuit diagram showing a driving signal generator 200 in accordance with the present invention.

As shown, the driving signal generator 200 includes a second delay unit 220 having a fifth to a seventh latch units 222 to 226 for delaying the write delay signal WTSTBYEN for one clock to three clocks respectively to thereby generate a first to a third outputs PRE_WTSTBY1 to PRE_WTSTBY3; and an output unit 240 for generating a driving signal WTSTBY by performing a logic operation to the first to the third outputs PRE_WTSTBY1 to PRE_WTSTBY3.

The output unit 240 includes a fifth NOR gate NR5 for receiving the first to the third outputs PRE_WTSTBY1 to PRE_WTSTBY3; and a second inverter I2 for generating the driving signal WTSTBY by inverting an output of the fifth NOR gate.

Herein, in comparison with the prior art, the driving signal generator 200 includes one more latch unit for generating the driving signal WTSTBY. Therefore, since an inactivation timing of the driving signal WTSTBY is delayed by one clock, an activation period width of the driving signal WTSTBY is extended.

Meanwhile, a structure and an operation of each of the fifth to the seventh latch units 222 to 226 are same to those of each of the first to the fourth latch units 122 to 128 shown in FIG. 6 having a tri-state inverter and an inverter.

Figure 8:
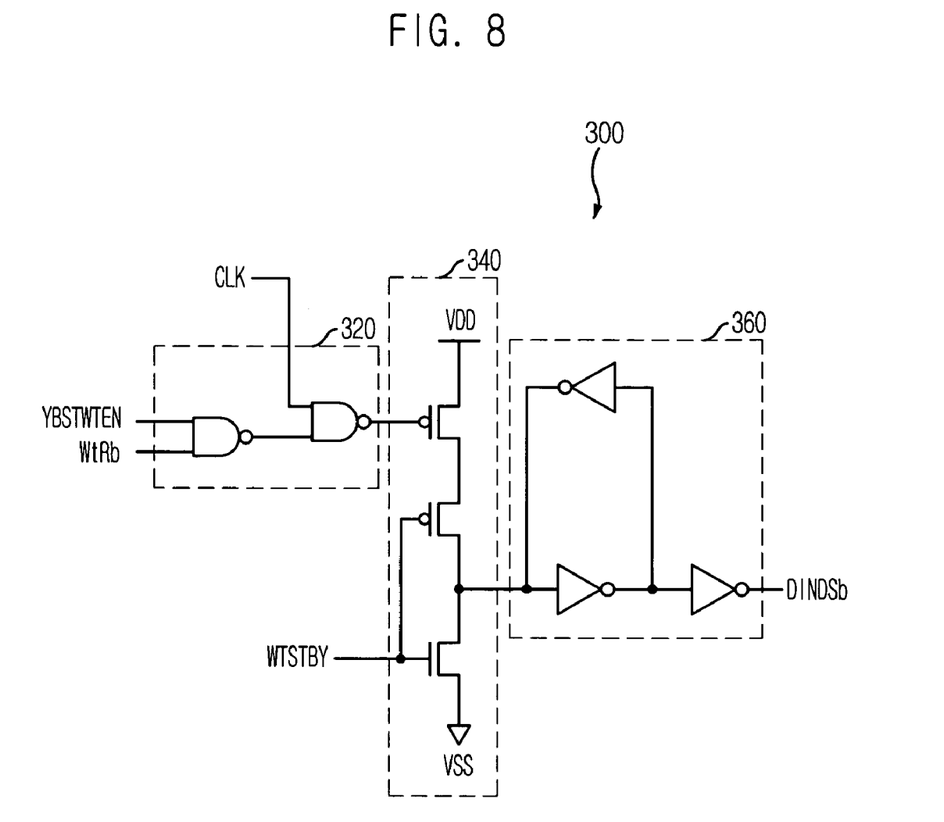
FIG. 8 is a schematic circuit diagram showing a data strobe signal generator in accordance with the present invention.

FIG. 8 is a schematic circuit diagram showing a data strobe signal generator 300 in accordance with the present invention.

As shown, the data strobe signal generator 300 includes a signal input unit 320 for receiving the control signals YBSTWTEN and WtRb; a signal generation unit 340 for generating a signal in response to the driving signal WTSTBY and an output of the signal input unit 320; and a signal output unit 360 for generating the data strobe signal DINDSb by latching and inverting an output of the signal generation unit 340.

In case that a burst length is 4, the data strobe signal generator 300 activates the data strobe signal DINDSb which is a row active signal while the driving signal WTSTBY is activated. In case that the burst length is 8, the data strobe signal generator 300 activates the data strobe signal DINDSb while the driving signal WTSTBY is activated and, then, the data strobe signal generator 300 activates the data strobe signal DINDSb for 2tCK in response to the control signal YBSTWTEN. Thereafter, when the read/write signal WtRb is in activated as a logic low level, i.e., at a read operation mode, the data strobe signal DINDSb is inactivated as a logic high level.

Figure 9:
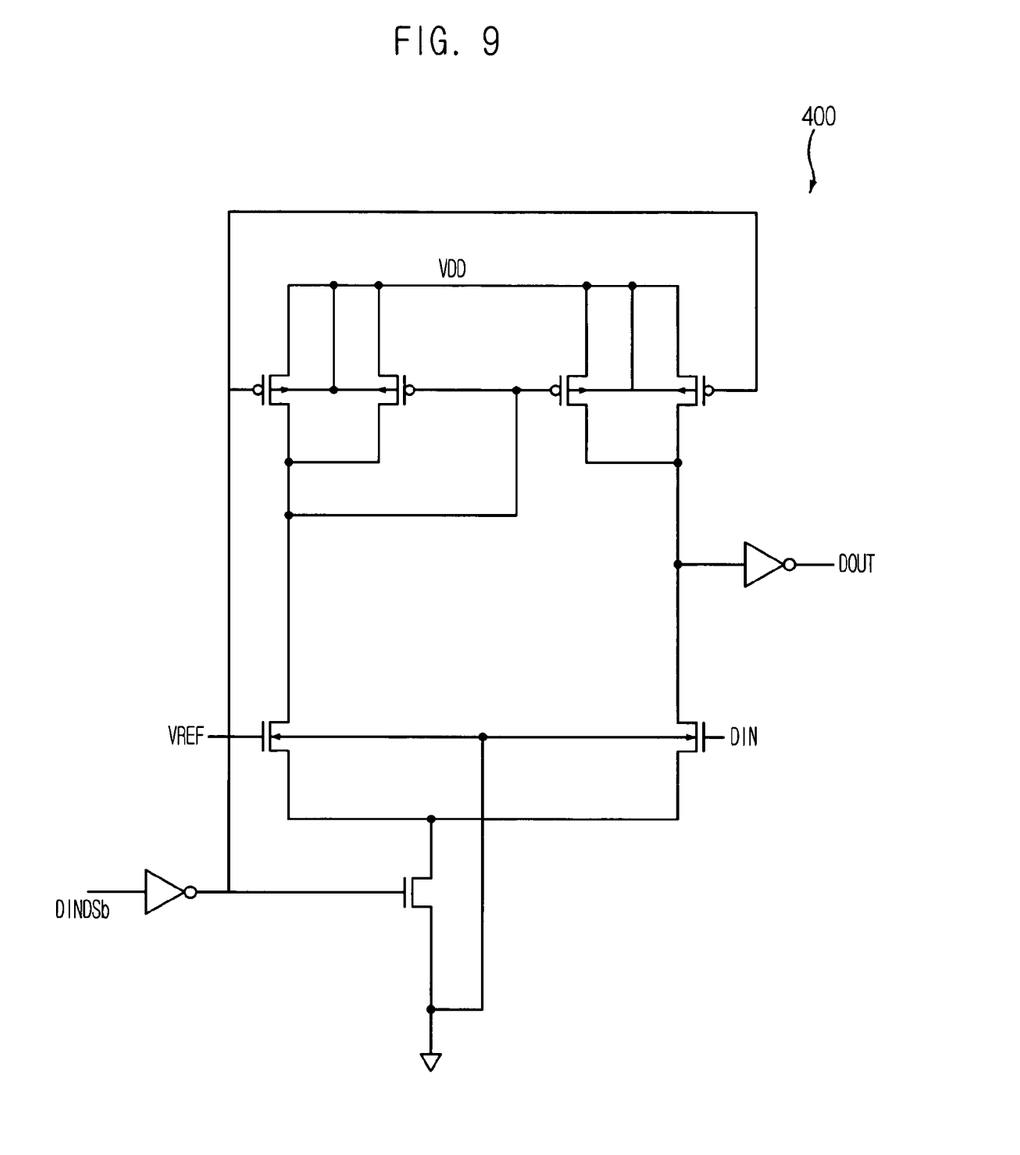
FIG. 9 is a schematic circuit diagram showing a data buffer in accordance with the present invention.

FIG. 9 is a schematic circuit diagram showing a data buffer 400 in accordance with the present invention.

As shown, the data buffer 400 includes a differential amplifier for receiving the data strobe signal DINDSb as a bias voltage and for receiving a reference voltage VREF and an external data DIN as a differential input to thereby generate an internal data DOUT.

Figure 10:
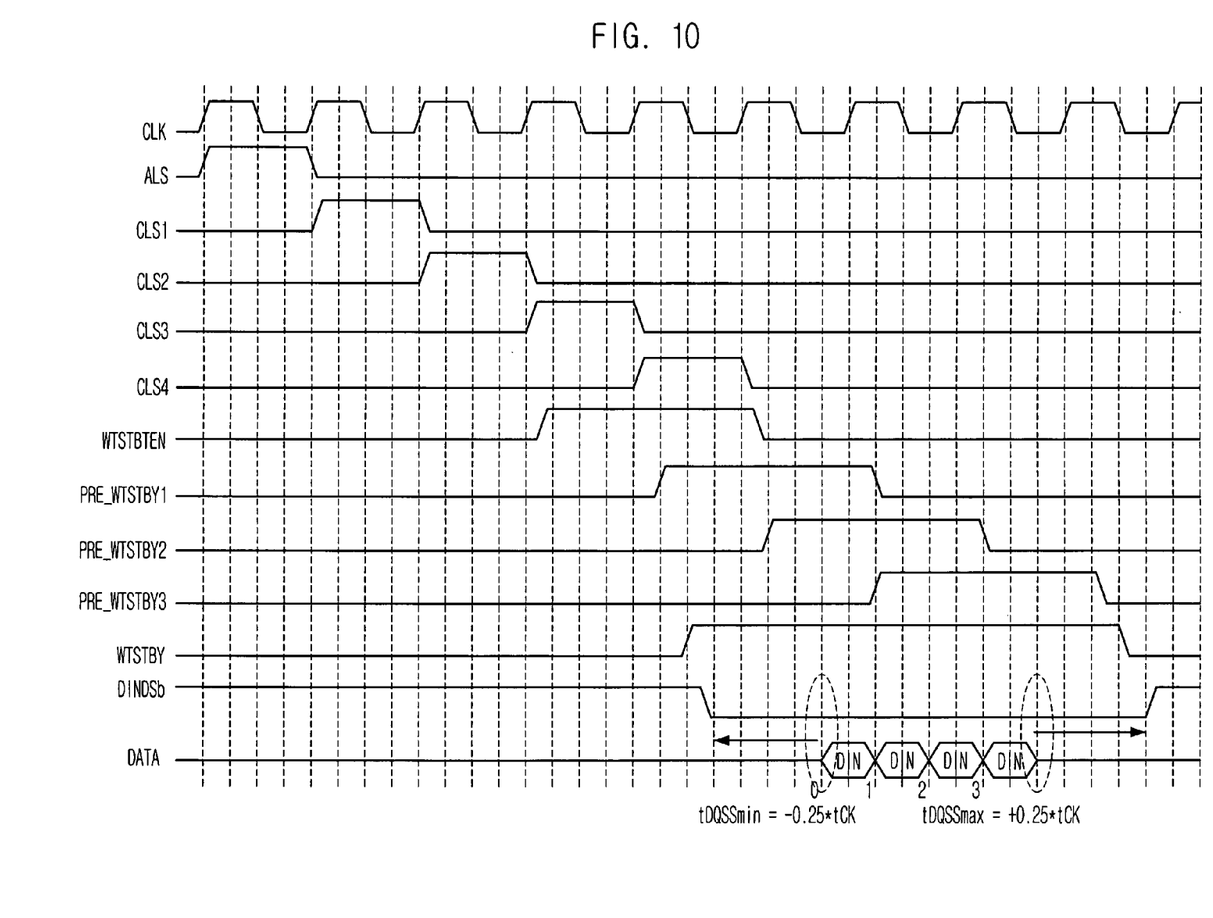
FIG. 10 is a wave diagram showing an operation of the semiconductor memory device in accordance with the present invention.

FIG. 10 is a wave diagram showing an operation of the semiconductor memory device in accordance with the present invention.

Referring to FIGS. 6 to 10, the operation of the semiconductor memory device for detecting the external data DIN as the internal data DOUT according to the data strobe signal DINDSb is described below.

Although not shown, the additive delay signal ALS is activated after the corresponding time of an additive latency (AL) is passed since the input of the write command. Thereafter, the CL counting unit 100 generates the first to the fourth CAS delay signals CLS1 to CLS4 by delaying the additive delay signal ALS for one clock to four clocks respectively. Then, the pulse width extension unit 140 performs a logic operation to a preceding CAS delay signal and a corresponding CAS delay signal in order to maintain an activation of a corresponding output signal which is a row active signal during an activation period of the preceding CAS delay signal and the corresponding CAS delay signal.

Thereafter, the selection unit 160 selects the fourth CAS dalay signal CLS4 and outputs the selected signal as the write delay signal WTSTBYEN in response to the first to the fifth CL indication signals CL2 to CL6.

Thereafter, the second delay unit 220 generates the first to the third outputs PRE_WTSTBY1 to PRE_WTSTBY3 by delaying the write delay signal WTSTBYEN for one clock to three clocks respectively. Then, the output unit 240 generates the driving signal WTSTBY which is activated during an activation period of the first to the third outputs PRE_WTSTBY1 to PRE_WTSTBY3.

Thereafter, the data strobe signal generator 300 generates the data strobe signal DINDSb which is a row active signal in response to the driving signal WTSTBY.

Accordingly, the external data DIN is detected as the internal data DIN through the data buffer 400 at an activation period of the data strobe signal DINDSb.

Therefore, in accordance with the present invention, an activation timing of a data strobe signal is advanced and an inactivation timing of the data strobe signal is delayed. As a result, a margin of a data strobe can be extended. That is, since the semiconductor memory device includes a pulse width extension unit, the activation timing of the data strobe signal can be advanced. Also, since one more latch unit for delaying a write delay signal is included in the semiconductor memory device, the inactivation timing of the data strobe signal can be delayed.

Accordingly, the semiconductor memory device can be stably operated at a high speed securing an enough margin of a data strobe signal.

The present application contains subject matter related to Korean patent application No. 2005-58892, filed in the Korean Patent Office on Jun. 30, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device for broadening a data I/O window, comprising:
   a buffer driving block for generating a buffer driving signal in response to an additive delay signal and a CAS delay signal, wherein an activation period of the buffer driving signal is determined based on the additive delay signal and a combination of delayed additive delay signals; and
   a data buffer for receiving an external data at an activation of the buffer driving signal.

2. The semiconductor memory device as recited in claim 1, wherein the buffer driving block includes:
   a first pulse generating block for generating a plurality of pulses based on a combination of the additive delay signal and the delayed additive signals and outputting one of the plurality of pulses as a write delay signal in response to the CAS delay signal; and
   a second pulse generating block for delaying the pulses and generating the buffer driving signal based on a combination of the delayed pulses.

3. The semiconductor memory device as recited in claim 2, wherein the buffer driving block further includes:
   a data strobe signal generating block for controlling the buffer driving signal in response to a plurality of control signals.

4. The semiconductor memory device as recited in claim 2, wherein the first pulse generating block includes:
   a first delay unit for generating a plurality of the CAS delay signals by delaying the additive delay signal, wherein the additive delay signal is activated after a corresponding time of an additive latency (AL) is passed since an input of a column command;
   a pulse width extension unit for extending an activation period of the plurality of the CAS delay signals; and
   a selection unit for outputting one of outputs of the pulse width extension unit as the write delay signal in response to a CL indication signal.

5. The semiconductor memory device as recited in claim 4, wherein the second pulse generating block includes:
   a second delay unit having a first to a third latch units connected in series, wherein each latch unit delays an output of a preceding latch unit for one clock and the first latch unit receives the write delay signal; and
   an output unit for generating the buffer driving signal by performing a logic operation to outputs of the first to the third latch units.

6. The semiconductor memory device as recited in claim 5, wherein the first delay unit includes a fourth to a seventh latch units connected in series each for receiving an output of a preceding latch unit in synchronization with a clock signal, wherein fourth latch unit receives the additive delay signal and the fourth to the seventh latch units respectively generates a first to a fourth CAS delay signals.

7. The semiconductor memory device as recited in claim 6, wherein each latch unit includes:
   a first transfer gate for transferring an input signal when the clock signal is in a logic high level;
   a first latch for latching an output of the first transfer gate when the clock signal is in a logic low level;
   a second transfer gate for transferring an output of the first latch when the clock signal is in a logic low level; and
   a second latch for latching an output of the second transfer gate when the clock signal is in a logic high level.

8. The semiconductor memory device as recited in claim 7, wherein each latch includes a tri-state inverter and an inverter.

9. The semiconductor memory device as recited in claim 8, wherein the pulse width extension unit includes:
   a first NOR gate for receiving the additive delay signal and the first CAS delay signal;
   a second NOR gate for receiving the first and the second CAS delay signals;
   a third NOR gate for receiving the second and the third CAS delay signals; and
   a fourth NOR gate for receiving the third and the fourth CAS delay signals.

10. The semiconductor memory device as recited in claim 9, wherein the selection unit includes a plurality of transfer gates for selecting one of the additive delay signal and the first to the fourth CAS delay signals and for outputting the selected signal in response to the CL indication signal.

11. The semiconductor memory device as recited in claim 4, wherein the data strobe signal generation unit includes:

a signal input unit for receiving the plurality of the control signals;

a signal generation unit for generating a signal in response to the buffer driving signal and an output of the signal input unit; and a signal output unit for outputting the buffer driving signal by latching and inverting an output of the signal generation unit.

12. The semiconductor memory device as recited in claim 10, the data buffer includes a differential amplifier for receiving the buffer driving signal as a bias voltage and for receiving a reference voltage and the external data as a differential input to thereby output an internal data.

* * * * *